(12) United States Patent
Russell et al.

(10) Patent No.: US 6,723,636 B1
(45) Date of Patent: Apr. 20, 2004

(54) METHODS FOR FORMING MULTIPLE DAMASCENE LAYERS

(75) Inventors: Noel M. Russell, Plano, TX (US); Kenneth Joseph Newton, McKinney, TX (US); Changming Jin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/447,513

(22) Filed: May 28, 2003

(51) Int. Cl.[7] .......................................... H01L 21/4763
(52) U.S. Cl. ...................... 438/634; 438/637; 438/638
(58) Field of Search ............................... 438/638, 634, 438/637, FOR 355, FOR 489

(56) References Cited

U.S. PATENT DOCUMENTS

| | | | | |
|---|---|---|---|---|
| 6,323,121 B1 | * | 11/2001 | Liu et al. | ..................... 438/633 |
| 6,331,479 B1 | * | 12/2001 | Li et al. | ....................... 438/618 |
| 6,383,919 B1 | * | 5/2002 | Wang et al. | ................. 438/638 |
| 6,475,904 B2 | * | 11/2002 | Okoroanyanwu et al. | ... 438/637 |
| 2003/0139034 A1 | * | 7/2003 | Yuang | .......................... 438/634 |

OTHER PUBLICATIONS

Makarem Hussein, Sam Sivakumar, Ruth Brain, Bruce Beattie, Phi Nguyen and Mark Fradkin, "*A Novel Approach To Dual Damascene Patterning*", IEEEElectron Devices Society, Intel Corporation, Portland Technology Development; (pgs. 3), 2002.

\* cited by examiner

*Primary Examiner*—George Fourson
*Assistant Examiner*—Michelle Estrada
(74) *Attorney, Agent, or Firm*—Peter K. McLarty; W. James Brady III; Frederick J. Telecky, Jr.

(57) ABSTRACT

According to one embodiment of the invention, a method for forming multiple layers of a semiconductor device is provided. The method includes defining a via through a dielectric layer that overlies a first layer. The first layer comprises a conductive portion that at least partly underlies the via. The method also includes overfilling the via with a dielectric material to form a second layer that overlies the dielectric layer. The method also includes forming a trench that is connected to the via by etching through the second layer and the dielectric material in the via.

4 Claims, 2 Drawing Sheets

METHODS FOR FORMING MULTIPLE DAMASCENE LAYERS

TECHNICAL FIELD OF THE INVENTION

This invention relates generally to the field of electronic devices and more particularly to an improved method for forming multiple damascene layers.

BACKGROUND OF THE INVENTION

Semiconductor devices are widely used in today's society. Many different types of structures may be adopted within a semiconductor device depending on the functions intended to be performed by the device. One such structure is a dual damascene structure. In forming a dual damascene structure, a trench is formed over a via so that the via may electrically couple the trench to an underlying conductor. To form a trench, the underlying via is generally filled with a polymer or other suitable material to provide a smooth surface for the deposition of the trench material. However, during the etching process to define the trench in the trench material, certain manufacturing problems may occur. For example, a protrusion, often referred to as a "fence" or a "veil," may be formed when the trench is etched to reach the polymer material that fills the via. Further, depending on the material that is used to fill the via, nitrogen-containing compounds may diffuse through the filler material and contaminate the photoresist that may be used to pattern the trenches. This problem is often referred to as "via poisoning."

Fences operate to increase the aspect ratio of a via, which makes the via harder to fill and decreases the reliability of the semiconductor device. Further, a fence may be bent over during the processing of the device, which makes the via difficult to fill. Any portion of photoresist that is contaminated by via poisoning cannot be patterned, which prevents a trench from being formed at the intended locations.

SUMMARY OF THE INVENTION

According to one embodiment of the invention, a method for forming multiple layers of a semiconductor device is provided. The method includes defining a via through a dielectric layer that overlies a first layer. The first layer comprises a conductive portion that at least partly underlies the via. The method also includes overfilling the via with a dielectric material to form a second layer that overlies the dielectric layer. The method also includes forming a trench that is connected to the via by etching through the second layer and the dielectric material in the via.

Some embodiments of the invention provide numerous technical advantages. Some embodiments may benefit from some, none, or all of these advantages. For example, according to one embodiment, reliability of a semiconductor device is increased by reducing the probability of fence formation. In another embodiment, probability of manufacturing error is reduced by preventing via poisoning. In another embodiment, the manufacturing process of a dual damascene structure is simplified.

Other technical advantages may be readily ascertained by one readily skilled in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS OF THE INVENTION

Embodiments of the invention are best understood by referring to FIGS. 1A through 2D of the drawings, like numerals being used for like and corresponding parts of the various drawings.

Figure 1A:
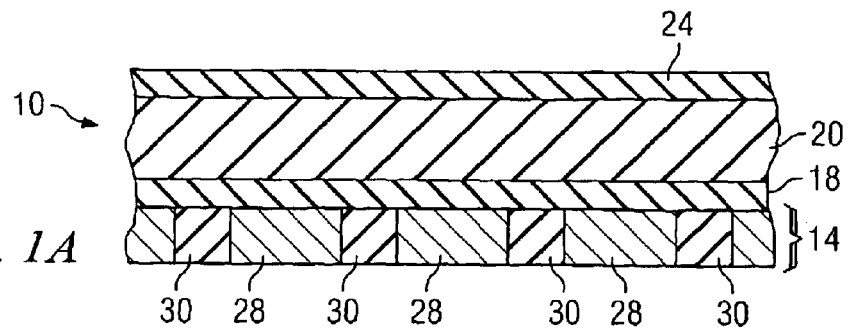
FIGS. 1A through 1D are a series of schematic cross-sectional diagrams illustrating one embodiment of a semiconductor device constructed according to the teachings of the present invention.

FIGS. 1A through 1D are a series of schematic cross-sectional diagrams illustrating one embodiment of a semiconductor device constructed according to the teachings of the present invention. Referring to FIG. 1A, a semiconductor device 10 includes a first metal layer 14 comprising conductive portions 28 and dielectric portions 30, a via etch stop layer 18, a dielectric layer 20, and a trench etch stop layer 24. Via etch stop layer 18 overlies metal layer 14, dielectric layer 20 overlies via etch stop layer 18, and trench etch stop layer 24 overlies dielectric layer 20. In some cases, etch stop layers 18 and/or 24 may be omitted.

Dielectric portion 30 may be formed from any suitable dielectric material, such as silicon oxide. Conductive portion 28 of metal layer 14 may be formed from any suitable conductive material, such as copper or aluminum. Via etch stop layer 18 may be formed from any suitable etch stop material, such as silicon carbide. Dielectric layer 20 may be formed from any suitable dielectric material, such as organo-silicate glass ("OSG"). Trench etch stop layer 24 may be formed from any suitable etch stop material, such as silicon carbide. Layers 18, 20 and 24 may be formed using any suitable process known in the semiconductor fabrication art, such as chemical vapor deposition ("CVD") or physical vapor deposition ("PVD".) To electrically couple conductive portions 28 to other overlying layers, vias that at least partly overly conductive portions 28 are often formed in layer 20. As used herein, a "via" refers to any aperture, such as a hole, that is operable to be filled with a conductive material to electrically couple different layers of a semiconductor device.

Conventionally, to form a via and a trench overlying the via, a layer of dielectric material is formed overlying layer 24 prior to the formation of the via in layer 20. The layer of dielectric material is often referred to as an "intermetal dielectric" or a "second metal layer" because, analogous to the first metal layer 14, the trenches formed in this layer will be filled with a conductive material. After forming the second metal layer, vias are patterned and etched through the second metal layer and the underlying layers 24 and 20. After vias are formed, the vias are filled up to the second metal layer using a polymer material, such as BARC, or spin on dielectric, such as DUO, which is available from Honeywell Corporation. After filling the vias, trenches overlying the vias are patterned and etched in the second metal layer. The etching process etches both a portion of the second metal layer and the material used to fill the vias, such as BARC, because trenches are generally wider than the vias. The etching of the trenches generally stop at etch stop layer 24. Where etch stop layer 24 is omitted, the etch process may be tuned so that the etching process stops approximately at the interface between the second metal layer and layer 20.

Polymer material, such as BARC, may etch slower than the material used to form the second metal layer. Because of this, during the etch process, a ring of the material used to form the second metal layer may be formed around a portion of the filler material that has etched slower than the second metal layer. This ring, or protrusion, is referred to as a fence. As described above, a "fence" is a protrusion that may be formed as a result of etching through both a dielectric material and a filler material, such as BARC. Fences may be problematic because they may increase the aspect ratio of a via, which makes the via harder to fill and decreases the reliability of device 10. Further, nitrogen-containing compounds from conductive portion 28 may diffuse through the filler material in a via and contaminate the photoresist layer that is used to pattern and etch the trenches in the second metal layer. Such a contamination may prevent trenches from being patterned and etched at the contaminated location.

According to some embodiments of the present invention, methods for forming multiple damascene layers having trenches and underlying vias are provided. In one embodiment, reliability of a semiconductor device is increased by reducing the probability of fence formation. In another embodiment, probability of manufacturing error is reduced by preventing via poisoning. In another embodiment, the manufacturing process of a dual damascene structure is simplified. Some embodiments may benefit from some, none, or all of these advantages. Additional details of example embodiments of the methods are provided below in conjunction with FIGS. 1B through 2D.

Figure 1B:
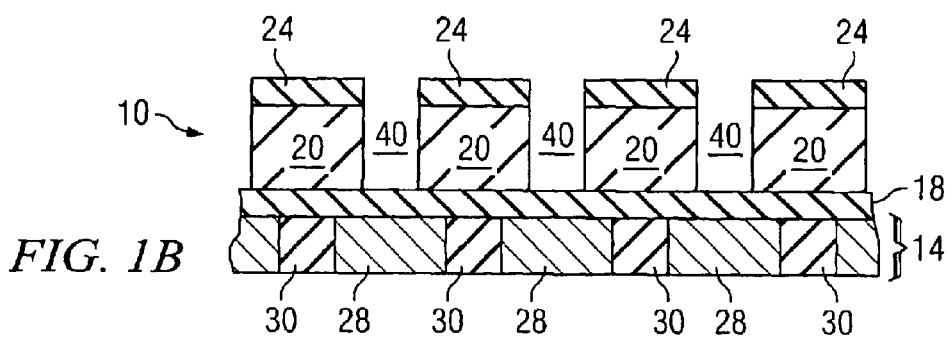

Referring to FIG. 1B, a plurality of vias 40 are defined in dielectric layer 20 prior to the formation of a second metal layer using any suitable processes, such as patterning and etching. In one embodiment where via etch stop layer 18 is omitted, the etching process used to etch via 40 is controlled so that a desired depth can be achieved without penetrating through conductive portion 28. As shown in FIG. 1B, each via 40 at least partly overlies a corresponding conductive portion 28.

Figure 1C:
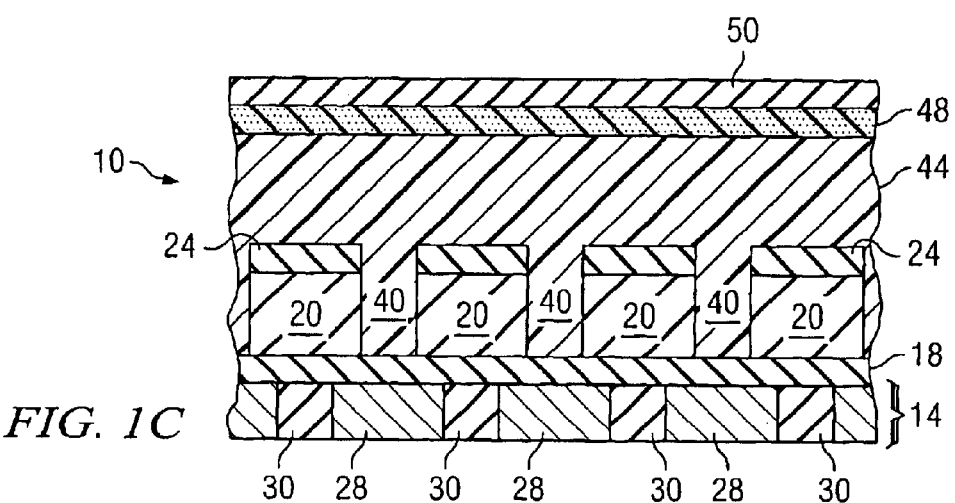

Referring to FIG. 1C, a second metal layer 44 overlying dielectric layer 20 (and trench etch stop layer 24, if used) is formed by overfilling vias 40 using a dielectric material. In one embodiment, the dielectric material used to overfill vias 40 and form layer 44 is a porous, MSQ-based material. In one embodiment, the dielectric material used to fill vias 40 and form layer 44 has a lower dielectric constant ("K") than that of dielectric layer 20. This is advantageous in some embodiments because line to line capacitance is reduced while mechanical integrity is not as severely compromised. Further, in one embodiment, etch selectivity can be achieved during the etching of trenches in layer 44 to stop the etch at dielectric layer 20 without using trench etch stop layer 24. Any suitable material that is operable to fill vias 40 may be used as material for filling vias 40 and forming layer 44.

In general, materials having properties such as low dielectric constant, high hardness, high elastic modulus, low coefficient of thermal expansion may be suitable candidates for filling vias 40 and forming layer 44. In one embodiment, the material for filling vias 40 and forming layer 44 may be any spin-on dielectrics that can provide good uniform via 40 filling and resistance-capacitance reduction. One example of such a material OSG with elemental compositions Si (10–40%), C (5–50%), O (10–50%), H (20–70%). Another example is Methyl silsesquioxane ("MSQ"), with elemental composition close to $SiO1.5(CH3)0.5$. One suitable MSQ is JSR 5109, available from Japan Synthetic Rubber Company). Another category of suitable material is inorganic where there is no carbon in the material. One example is Hydrogen silsesquioxane ("HSQ"), with element composition close to $SiO1.5H0.5$. One suitable HSQ is FOX, available from Dow Corning.

In one embodiment, pores can be incorporated into a material for filling vias 40 and forming layer 44 to further reduce the dielectric constant. The pores can be incorporated through the burning out of porogens, using sol-gel processes, or may be made inside the liquid precursor compounds. Examples are porous MSQ and porous HSQ.

In one embodiment, vias 44 may be overfilled to form layer 44 by spinning on the dielectric material; however, any suitable method for overfilling vias 40 to form layer 44 may be used. In contrast to prior art where the material used to fill vias 40 were different from the material used to form overlying layer 44, using the same dielectric material to fill vias 40 and form layer 44 is advantageous because the probability of fence formation is reduced during the trench etch process.

In one embodiment, a cap layer 48 that overlies layer 44 is provided. This is advantageous in some embodiments of the invention because compounds that may poison a photoresist layer used to pattern and etch trenches are blocked from diffusing through the material that fills vias 40 and form layer 44. Cap layer 48 may be formed from any suitable material that is operable to block the diffusion of contaminants. Example materials for forming cap layer 48 include silicon carbide, silicon oxide, and tantalum nitride. In one embodiment, cap layer 48 may be omitted. In one embodiment, a hardmask 50 that overlies cap layer 48 may be provided. However, in some embodiments, hardmask 50 may also be omitted.

Figure 1D:
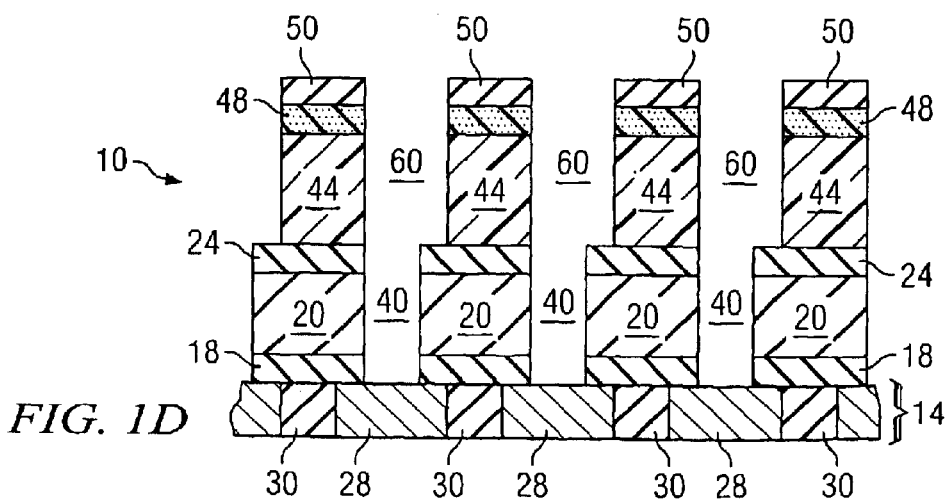

Referring to FIG. 1D, trenches 60 are formed through layers 50, 48, and 44, using any suitable method, such as patterning and etching. As shown in FIG. 1D, portions of dielectric layer 20 that are protected by trench etch stop layer 24 are not removed by the etching of trenches 60. As shown in FIG. 1D, each trench 60 is connected to a corresponding via 40. In one embodiment, using the same process to form trenches 60, the material used to fill vias 40 and the portions of via etch stop layer 18 that separated vias 40 from their corresponding conductive portions 28 are also removed. The etching process used for forming trenches 60 may also be used to simultaneously clean out vias 40 and remove the appropriate portions of via etch stop layer 18 to expose conductive portion 28. "Simultaneously" cleaning out vias 40 and removing portions of via etch stop layer 18 refers to cleaning out vias 40 and removing portions of via etch stop layer 18 during the same removal process used to form trenches 60. For example, forming trenches 60 using an etch process, and then continuing to etch through the filler material in vias 40 using the same etch process may be referred to as simultaneously forming trenches 40 and cleaning out vias 40. The portions of via etch stop layer 18 may be removed to exposed conductive portions 28 using a separate removal process. Simultaneously forming trenches 60, cleaning out vias 40, and exposing conductive portions 28 is advantageous in some embodiments because the process for forming a dual damascene structure is simplified.

Figure 2A:
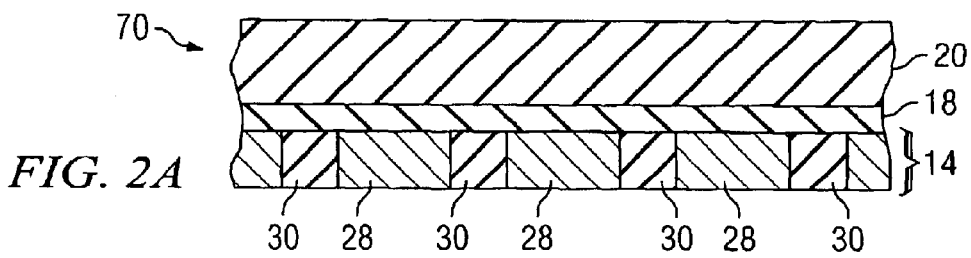
FIGS. 2A through 2D are a series of schematic cross-sectional diagrams illustrating another embodiment of a semiconductor device constructed according to the teachings of the present invention.

FIG. 2A is a schematic cross-sectional diagram illustrating one embodiment of a semiconductor device 70 that may benefit from the teachings of the present invention. Device 70 includes metal layer 14, via etch stop layer 18, and dielectric layer 20. Device 70 does not include a trench etch stop layer. This is advantageous in some embodiments of the invention because line-to-line capacitance, which is increased by the presence of a trench etch stop layer, is reduced.

Figure 2B:
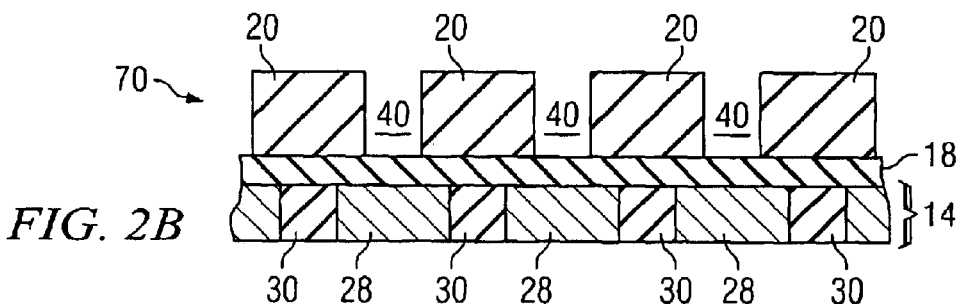
Figure 2C:
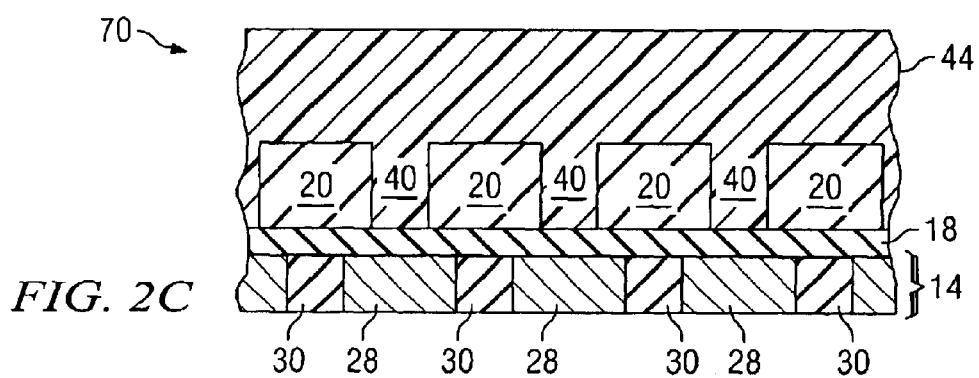

Referring to FIG. 2B, vias 40 are formed in dielectric layer 20 using any suitable process, such as patterning and etching. Referring to FIG. 2C, metal layer 44 is formed by overfilling vias 40 using a dielectric material that is operable to fill via 40. In one embodiment, overfilling vias 40 to form layer 44 may be accomplished by spinning on the dielectric material. Any suitable material that is operable to fill vias 40 may be used as material for filling vias 40 and forming layer 44, as described above in conjunction with FIG. 1C. In one embodiment, material identified by model number "JSR 5109," available from Japan Synthetic Rubber company, may be used as the material to overfill vias 40 and form layer 44. In one embodiment, the material used to overfill vias 40 and form layer 44 has a lower dielectric constant than dielectric layer 20.

Figure 2D:
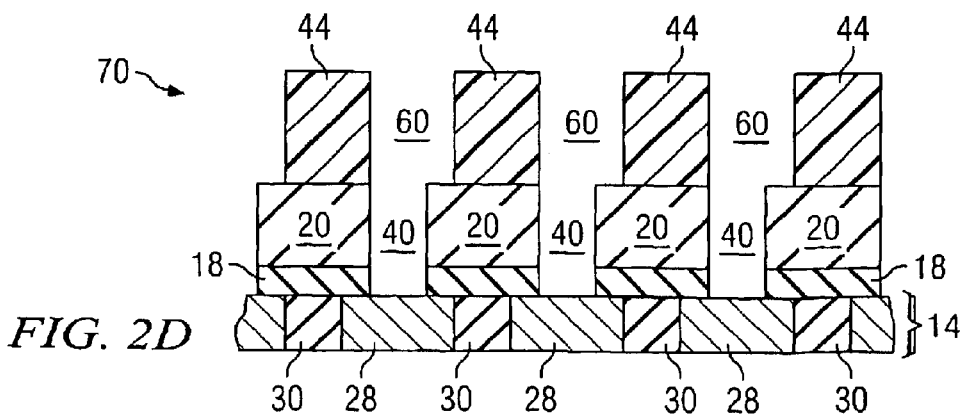

Referring to FIG. 2D, trenches 60 are formed in layer 44 using any suitable process, such as patterning and etching. In one embodiment, using the same process, vias 40 are cleaned out and portions of via etch stop layer 18 that correspond to vias 40 are removed so that the conductive portions 28 are exposed. As shown in FIG. 2D, device 70 does not include a cap layer or a hardmask layer. However, a cap layer and/or a hardmask layer may be formed over layer 44 prior to the formation of trenches 60, in some embodiments.

Because device 70 does not include a trench etch stop layer, any etch process used to form trenches 60 and simultaneously clean out vias 40 may require tuning to prevent damage to other features of device 70. Aspects of etching that may require tuning include achieving adequate selectivity to stop etching at layer 20 while etching trenches in layer 44. Using a material having a lower dielectric constant to form layer 44 may facilitate the tuning process, in one embodiment.

Although some embodiments of the present invention have been described in detail, it should be understood that various changes, substitutions, and alterations can be made hereto without departing from the spirit and scope of the invention as defined by the appended claims.

What is claimed is:

1. A method, comprising:
    providing a first metal layer comprising a plurality of conductive portions and a plurality of dielectric portions;
    forming a via etch stop layer overlying the first metal layer;
    forming a dielectric layer overlying the via etch stop layer;
    forming a trench etch stop layer overlying the dielectric layer;
    etching a plurality of vias that reach the via etch stop layer through the trench etch stop layer and the dielectric layer, each via at least partly overlying a particular one of the conductive portions;
    overfilling the vias with a dielectric material to a level sufficient to form a second metal layer overlying the dielectric layer, the dielectric material having a lower dielectric constant than the first metal layer;
    forming a cap layer overlying the second metal layer; and
    defining a plurality of trenches each connected to and at least partly overlying a particular one of the vias by etching through the cap layer, the second metal layer, the dielectric material in the respectively underlying vias, and the via etch stop layer to reach the conductive portions respectively underlying the vias.

2. The method of claim 1, wherein overfilling the vias comprises spinning on the dielectric material.

3. The method of claim 1, wherein defining the trenches comprises defining the trenches and cleaning out the vias using a single etch process.

4. The method of claim 1, wherein the dielectric layer comprises organo-silicate glass.

* * * * *